United States Patent
Tanaka et al.

(10) Patent No.: US 12,157,189 B2
(45) Date of Patent: Dec. 3, 2024

(54) JUNCTION STRUCTURE, METHOD FOR MANUFACTURING JUNCTION STRUCTURE, AND SOLDER BALL

(71) Applicants: NIPPON STEEL CHEMICAL & MATERIAL CO., LTD., Tokyo (JP); NIPPON MICROMETAL CORPORATION, Saitama (JP)

(72) Inventors: Masamoto Tanaka, Tokyo (JP); Kiyotsugu Komori, Saitama (JP); Keisuke Akashi, Saitama (JP); Katsuhiko Hoshino, Saitama (JP); Tsunekazu Yamazaki, Saitama (JP); Takayuki Kobayashi, Tokyo (JP); Sukeyoshi Yamamoto, Tokyo (JP); Kensuke Misawa, Tokyo (JP)

(73) Assignees: NIPPON STEEL Chemical & Material Co., Ltd., Tokyo (JP); NIPPON MICROMETAL CORPORATION, Saitama (JP)

(*) Notice: Subject to any disclaimer, the term of this patent is extended or adjusted under 35 U.S.C. 154(b) by 518 days.

(21) Appl. No.: 17/605,844

(22) PCT Filed: Mar. 25, 2020

(86) PCT No.: PCT/JP2020/013428
§ 371 (c)(1),
(2) Date: Oct. 22, 2021

(87) PCT Pub. No.: WO2020/217833
PCT Pub. Date: Oct. 29, 2020

(65) Prior Publication Data
US 2022/0241903 A1    Aug. 4, 2022

(30) Foreign Application Priority Data

Apr. 22, 2019  (JP) .................. 2019-081154
Apr. 22, 2019  (JP) .................. 2019-081155

(51) Int. Cl.
*B23K 35/30*  (2006.01)
*B23K 35/02*  (2006.01)
(Continued)

(52) U.S. Cl.
CPC ...... *B23K 35/3013* (2013.01); *B23K 35/0244* (2013.01); *B23K 2101/40* (2018.08); *H01L 33/62* (2013.01); *H01L 2933/0066* (2013.01)

(58) Field of Classification Search
CPC ............ B23K 35/3013; B23K 35/0244; B23K 2101/40
See application file for complete search history.

(56) References Cited

U.S. PATENT DOCUMENTS

2019/0067235 A1* 2/2019 Choi .................. H01L 24/83

FOREIGN PATENT DOCUMENTS

JP  2000-31313 A   1/2000
JP  2014-54653 A   3/2014
(Continued)

OTHER PUBLICATIONS

International Search Report issued in International Application No. PCT/JP2020/013428, dated Jun. 16, 2020 w/ English Translation.

*Primary Examiner* — Samuel A Gebremariam
(74) *Attorney, Agent, or Firm* — Rimon P.C.

(57) ABSTRACT

Provided is a joint structure. The joint structure includes a first structure, and a second structure joined to the first structure via a joint portion formed of a Au—Sn-based alloy, wherein a thickness of the joint portion is 3 μm or more and 50 μm or less.

16 Claims, 10 Drawing Sheets

(51) Int. Cl.
*B23K 101/40* (2006.01)
*H01L 33/62* (2010.01)

(56) References Cited

FOREIGN PATENT DOCUMENTS

| | | | |
|---|---|---|---|
| JP | 2017-100176 | A | 6/2017 |
| JP | 2017-189793 | A | 10/2017 |
| JP | 2018-65149 | A | 4/2018 |

\* cited by examiner

JUNCTION STRUCTURE, METHOD FOR MANUFACTURING JUNCTION STRUCTURE, AND SOLDER BALL

CROSS REFERENCE TO RELATED APPLICATIONS

This application is the U.S. National Phase under 35 U.S.C. § 371 of International Application No. PCT/JP2020/013428, filed on Mar. 25, 2020, which claims the benefit of Japanese Application No. 2019-081154, filed on Apr. 22, 2019 and Japanese Application No. 2019-081155, filed Apr. 22, 2019, the entire contents of each are hereby incorporated by reference.

TECHNICAL FIELD

The present invention relates to a joint structure, a method for manufacturing the joint structure, and a solder ball.

BACKGROUND ART

As a joint structure, a sealing package that hermetically seals a semiconductor light emitting device and a device is known. A semiconductor light emitting device includes a semiconductor light emitting element and a circuit board on which the semiconductor light emitting element is mounted. The sealing package hermetically seals, for example, a surface acoustic wave (SAW) filter, a film bulk acoustic resonator (FBAR) filter, and a crystal resonator as an electronic device. As a joining material of these joint structures, a solder paste or a sheet-shaped brazing material formed of a Au—Sn-based alloy is used from the viewpoint of high strength, high electrical conductivity, and the like (for example, PTL 1 and 2).

PTL 1 discloses a solder paste containing a AuSn powder and a flux. In the solder paste of PTL 1, oxidation is suppressed by making particles constituting the powder have a structure in which the proportion of Au increases toward the layer on the outer side of the particle which is vulnerable to oxidization.

PTL 2 discloses a cap including a tape made of a AuSn brazing material. The cap of PTL 2 is obtained by pressing out a clad material obtained by stacking a tape of a AuSn brazing material and a tape of a substrate obtained by applying Ni or Au plating to a FeNi-based material and heat-fusing the brazing material and the substrate.

CITATION LIST

Patent Literature

PTL 1: JP 2017-100176 A
PTL 2: JP 2000-31313 A

SUMMARY OF THE INVENTION

Technical Problem

In the joining using the solder paste as in PTL 1, since the AuSn alloy particles are dispersed in the flux and used, there is a possibility that partially unfused joining occurs in which the AuSn alloy particles are not bonded and isolated during reflow. In addition, when the AuSn alloy particles are bonded to each other, there is a possibility that foreign substance-inclusion joining where foreign substances such as a flux or the like are included in the joining occurs. In addition, since it is necessary to supply a predetermined amount of a solder paste to a joining site by printing, discharging, or the like, it is difficult to reduce the thickness of the joint portion after reflow. As described above, in the paste joining involving melting and joining the AuSn alloy particles, there is a high possibility of forming partially unfused joining or foreign substance-inclusion joining, and it is difficult to reduce the thickness of the joint portion, posing a problem that electrical conductivity, thermal conductivity, or hermeticity is impaired and improvement of the quality is difficult.

In addition, the sheet-shaped brazing material as in PTL 2 has a problem that it is difficult to reduce the thickness because the material thereof is hard and brittle, and it is difficult to improve the quality such as thermal conductivity because the thickness of the joint portion formed by melting the sheet-shaped brazing material also increases.

In the joining using the solder paste as in PTL 1, it is necessary to supply a predetermined amount of a solder paste to the joining site by printing, discharging, or the like, and thus there is a limitation on reducing the amount of Au used. In addition, since the sheet-shaped brazing material as described in PTL 2 is formed into a predetermined size and shape by punching out from the clad material by pressing, the remaining pressed clad material is wasted, resulting in a low yield. As a result, there is a problem that it is difficult to reduce the amount of Au used.

By using Au—Sn-based alloy solder balls instead of a solder paste or a brazing material tape, it can be expected to reduce the amount of Au used. On the other hand, the Au—Sn-based alloy solder balls have a problem that appearance defects due to shrinkage cavities occur.

A first object of the present invention is to provide a joint structure capable of improving quality and a method for manufacturing the joint structure.

A second object of the present invention is to provide a solder ball capable of preventing the occurrence of appearance defects due to shrinkage cavities.

Solution to Problem

A joint structure according to the present invention is a joint structure including a first structure and a second structure joined to the first structure via a joint portion formed of a Au—Sn-based alloy, in which a thickness of the joint portion is 3 µm or more 50 µm or less.

A method for manufacturing a joint structure according to the present invention is a method for manufacturing a joint structure, the joint structure including a first structure and a second structure joined to the first structure via a joint portion formed of a Au—Sn-based alloy, the method including: a ball fixing step of fixing a solder ball formed of the Au—Sn-based alloy to a first joint surface of the first structure; and a step of turning over the first structure with respect to the second structure with the first joint surface facing the second joint surface of the second structure to electrically connect the first joint surface and the second joint surface, in which a thickness of the joint portion is 3 µm or more and 50 µm or less.

A solder ball according to the present invention is a solder ball containing Sn of 19 mass % or more and 25 mass % or less and a balance containing Au as a main component, in which the solder ball contains any one element of Fe, Cr, and Ni, a concentration of Fe in a case of containing Fe is 0.1 ppm by mass or more and 10 ppm by mass or less, a concentration of Cr in a case of containing Cr is 0.1 ppm by mass or more and 100 ppm by mass or less, and a concentration of Ni in a case of containing Ni is 1 ppm by mass or more and 5,000 ppm by mass or less, with respect to the entire solder ball.

A solder ball according to the present invention is a solder ball containing Sn of 19 mass % or more and 25 mass % or less and a balance containing Au as a main component, in which the solder ball contains a combination of at least two or more elements selected from Fe, Cr, and Ni, a total concentration of the combination of the elements is more than 0.1 ppm by mass and 5,000 ppm by mass or less with respect to the entire solder ball, a concentration of Fe in a case of containing Fe is 0.1 ppm by mass or more and 10 ppm by mass or less, a concentration of Cr in a case of containing Cr is 0.1 ppm by mass or more and 100 ppm by mass or less, and a concentration of Ni is in a range of 0 ppm by mass or more and 4,990 ppm by mass or less.

A solder ball according to the present invention is a solder ball containing Sn of 19 mass % or more and 25 mass % or less and a balance containing Au as a main component, in which a central cross section of the solder ball includes a lamellar structure composed of a first phase mainly composed of $Au_5Sn$ and a second phase mainly composed of AuSn, and in four frames having a square shape and evenly disposed in a circumferential direction of the solder ball, the frame having, as a diagonal line, a line segment having a length of 5 μm from a position where a line passing through a center of the solder ball and parallel to the central cross section intersects with an outer edge of the solder ball toward the center, an average number of the first phases being massive and having longitudinal and lateral lengths two times or more an interval between the first phase and the second phase is three or less.

Advantageous Effects of the Invention

According to the present invention, when the thickness of the joint portion is 3 μm or more and 50 μm or less, thermal conductivity is high, and quality as a joint structure can be improved.

According to the present invention, a uniform eutectic alloy of Au and Sn can be obtained, and the occurrence of appearance defects due to shrinkage cavities on the solder ball surface can be prevented.

DESCRIPTION OF EMBODIMENTS

Figure 1:
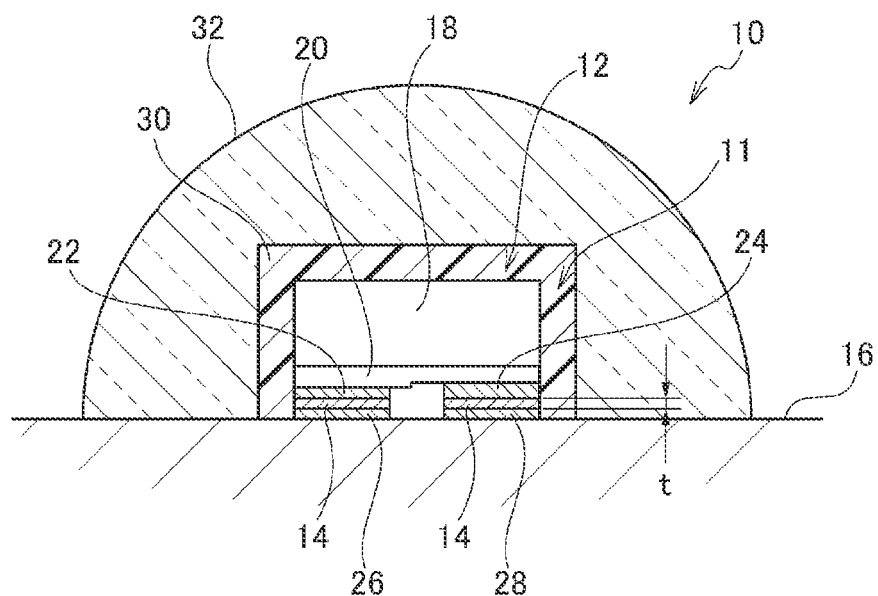
FIG. 1 A partial cross-sectional view schematically showing an LED package according to a first embodiment.

Hereinafter, embodiments of the present invention will be described in detail with reference to the drawings. The same components are denoted by the same reference numerals, and the description thereof will be omitted as appropriate.

1. First Embodiment (1) Joint Structure

A light emitting diode (LED) package 10 shown in FIG. 1 includes a semiconductor light emitting device 11 as a joint structure. The semiconductor light emitting device 11 includes an LED chip 12 as a first structure and a ceramic substrate 16 as a second structure joined to the LED chip 12 via a joint portion 14 formed of a solder alloy.

The LED chip 12 is a light emitting element including a substrate 20 and a crystal layer 18 that is formed on the substrate 20 and includes a light emitting layer. An electrode 22 and an electrode 24 are formed on the surface of the substrate 20 opposite to the side where the crystal layer 18 is formed. The electrode 22 and the electrode 24 are made of a conductive material such as Au, Ag, Cu, or Al. The LED chip 12 is a flip-chip type light emitting element including the electrodes 22 and 24 facing downward. One of the electrodes 22 and 24 is an n-side electrode, and the other is a p-side electrode.

As the ceramic substrate 16, a substrate having excellent heat dissipation is preferably used. For example, an aluminum nitride substrate (AlN), a silicon nitride substrate ($Si_3N_4$) having high thermal conductivity, or a DCB substrate (a copper circuit board is directly joined to an alumina-based oxide ceramic substrate) can be used. An electrode 26 and an electrode 28 are formed on the ceramic substrate 16. The electrode 26 and the electrode 28 are formed of the same material as the electrodes 22 and 24, and may be of the same type as or different type from the material of the electrodes 22 and 24.

The joint portion 14 is formed using a solder ball described later. The joint portion 14 has a thickness t of 3 μm or more and 50 μm or less. The thickness t of the joint portion 14 is a distance between the surfaces of the electrodes 22 and 24 as the first joint surface and the surfaces of the electrodes 26 and 28 as the second joint surface. When the thickness t of the joint portion 14 is within the above range, the LED chip 12 and the ceramic substrate 16 come close to each other, and the heat generated in the LED chip 12 can be efficiently transferred to the ceramic substrate 16. The thickness t of the joint portion 14 is preferably 3 µm or more and less than 35 µm, and more preferably 3 µm or more and less than 20 µm. As the thickness t of the joint portion 14 is thinner, thermal conductivity can be improved.

The joint portion 14 is a Au—Sn-based alloy. Since the joint portion 14 is a Au—Sn-based alloy, joint strength is higher than that of an Sn—Ag—Cu-based alloy. The joint portion 14 is formed of a solder ball containing Sn of 19 mass % or more and 25 mass % or less and containing Au as a main component. The joint portion 14 may contain elements derived from the electrodes 22, 24, 26, and 28 in addition to elements derived from the solder ball.

The joint portion 14 may contain Sn of 19 mass % or more and 25 mass % or less, may contain one or more elements of Fe, Cr, Ni, Cu, Co, and Ti, and the balance may contain Au as a main component. The balance may be composed of Au and inevitable impurities.

The joint portion 14 contains Sn of 19 mass % or more and 25 mass % or less, contains any one element of Fe, Cr, and Ni, and the balance contains Au as a main component. The balance may be composed of Au and inevitable impurities. In the joint portion 14, the concentration of Fe in the case of containing Fe is 0.1 ppm by mass or more and 10 ppm by mass or less, the concentration of Cr in the case of containing Cr is 0.1 ppm by mass or more and 100 ppm by mass or less, and the concentration of Ni in the case of containing Ni is 1 ppm by mass or more and 5,000 ppm by mass or less with respect to the entire joint portion 14.

The joint portion 14 contains Sn of 19 mass % or more and 25 mass % or less, contains a combination of two or more elements of Fe, Cr, and Ni, and the balance contains Au as a main component. The balance may be composed of Au and inevitable impurities. The concentration of each of Fe and Cr among the elements is in the above concentration range. The concentration of Ni is in a range of 0 ppm by mass or more and 4,990 ppm by mass or less, and the total concentration of the combination of the elements with respect to the entire joint portion 14 is more than 0.1 ppm by mass and 5,000 ppm by mass or less. Each concentration range will be described in detail later.

The LED chip 12 is covered with a covering portion 30, and the covering portion 30 is covered with a lens portion 32. The covering portion 30 is formed of a transparent resin such as a silicone resin or an epoxy resin. The covering portion 30 may further contain a particulate phosphor. The lens portion 32 is formed by forming a silicone resin into a lens shape. In the LED package 10, the color of light to be emitted can be selected by a combination of the emission color of the LED chip 12 and the fluorescent color of the phosphor. For example, by setting the emission color of the LED chip 12 to blue and setting the fluorescent color of the phosphor to yellow, white light can be emitted from the LED package 10.

(2) Solder Ball

Figure 2A:
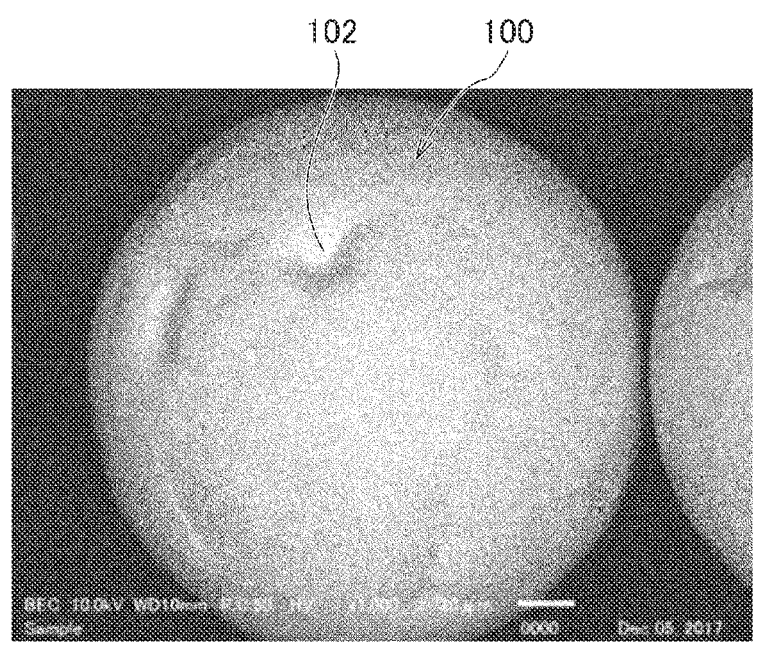
FIG. 2A An SEM photograph of a surface of a solder ball of a conventional example.
Figure 2B:
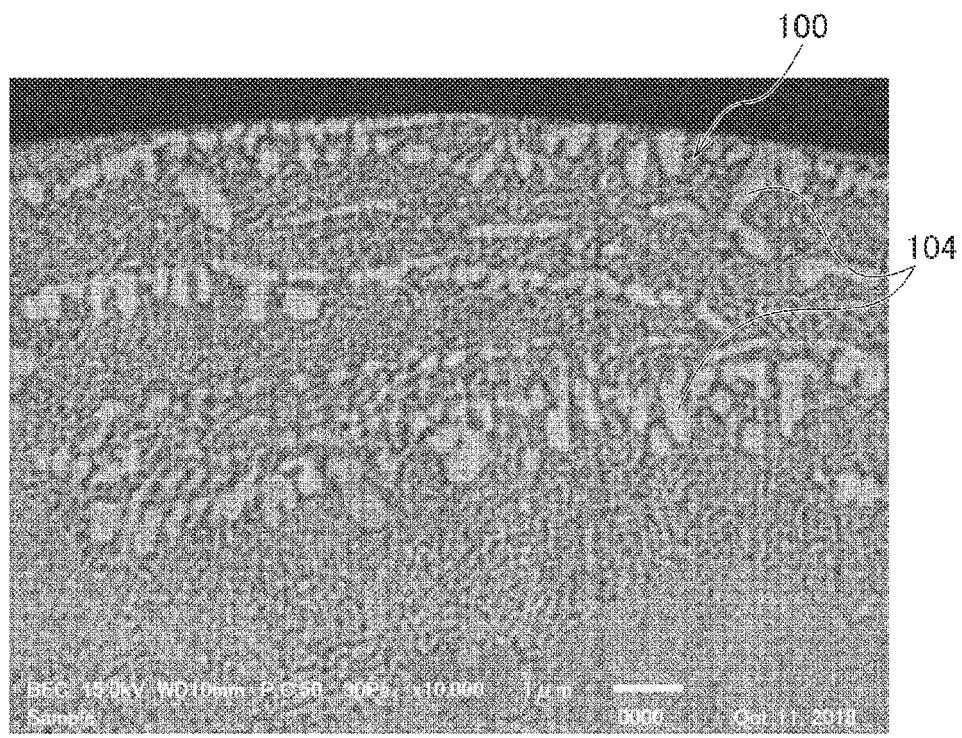
FIG. 2B An SEM photograph of a cross section of a solder ball of a conventional example.

As shown in FIG. 2A, a solder ball 100 made of a conventional Au—Sn-based alloy has a problem that irregularities 102 are generated on the surface thereof, and in some cases, appearance defects due to shrinkage cavities occur. In the solder ball 100, generation of a non-uniform Au-rich phase 104 was confirmed in the vicinity of the surface in the cross section (FIG. 2B). From this, the shrinkage cavity is considered to be greatly affected by the generation of the non-uniform Au-rich phase 104.

Figure 3A:
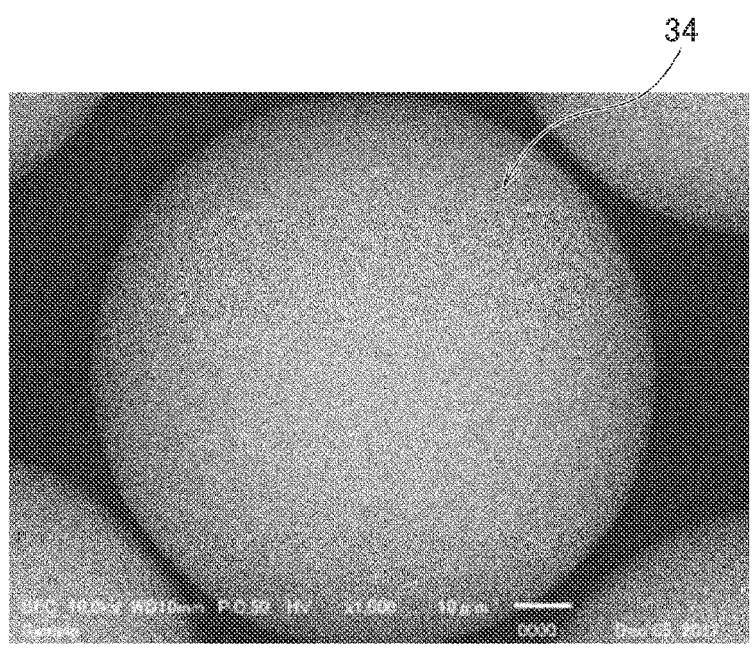
FIG. 3A An SEM photograph of a surface of a solder ball according to the first embodiment.

A solder ball 34 according to the present embodiment shown in FIG. 3A is a Au—Sn-based alloy containing Sn of 19 mass % or more and 25 mass % or less and Au as a main component, and is a uniform eutectic alloy of $Au_5Sn_1$ and AuSn formed by containing at least one element of Fe, Cr, and Ni. Therefore, the solder ball 34 can prevent the occurrence of shrinkage cavities on the surface, and thus has a good appearance (FIG. 3A).

Figure 3B:
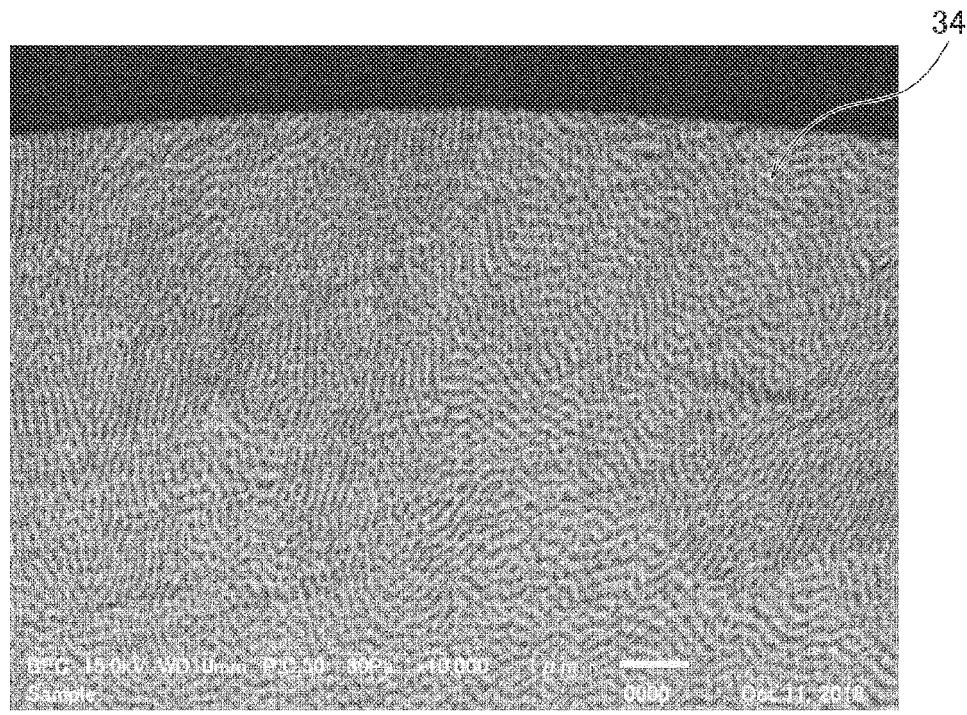
FIG. 3B An SEM photograph of a cross section of the solder ball according to the first embodiment.

In the solder ball 34, since trace amounts of Fe, Cr, and Ni are dispersed in AuSn, there are many nucleation sites during solidification. Thus, a uniform lamellar structure is formed by the first phase (also referred to as a Au-rich phase) mainly composed of $Au_5Sn$ and the second phase mainly composed of AuSn without generating a non-uniform Au-rich phase during cooling (FIG. 3B). Therefore, in the solder ball 34 according to the present embodiment, a lamellar structure without a non-uniform Au-rich phase is formed, making it possible to obtain a good appearance without shrinkage cavities.

Figure 4A:
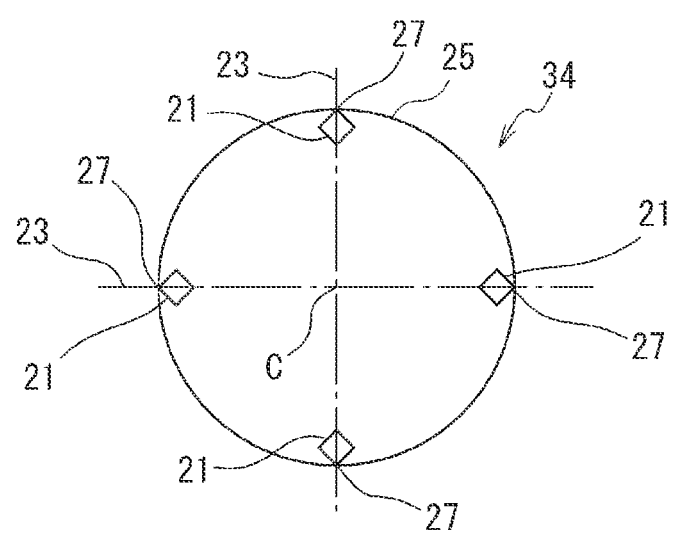
FIG. 4A A schematic view of a solder ball used in describing a method for evaluating the uniformity of a lamellar structure.

Hereinafter, a method for evaluating the uniformity of the lamellar structure of the solder ball 34 will be described. First, as shown in FIG. 4A, four square frames 21 are evenly disposed in the circumferential direction in the central cross section of the solder ball 34. The central cross section is a cross section including the center C of the solder ball 34. The frame 21 has, as a diagonal line, a line segment having a length of 5 µm from a position 27 where a line 23 passing through a center C of the solder ball 34 and parallel to the central cross section intersects with an outer edge 25 of the solder ball 34 toward the center C. In the present specification, the "center portion" and "center" are not limited to the case of being completely "center portion" and "center", and include the case of being slightly deviated from the case of being completely "center portion" and "center".

Next, for each frame 21, the number of massive first phases (non-uniform Au-rich phases) 104 having longitudinal and lateral lengths that are twice or more the interval between the first phase and the second phase in the lamellar structure is counted. The interval between the first phase and the second phase is a distance from the center of the first phase to the center of the second phase, and is, for example, a value measured in the lamellar structure at the center portion of the solder ball 34. The center portion of the solder ball 34 may be, for example, a portion where a distance from the center of the solder ball 34 is within a range of 10% of the diameter of the solder ball 34. The interval between the first phase and the second phase is, for example, approximately 0.1 µm to 0.5 µm. The longitudinal and lateral lengths are lengths in any two orthogonal directions in the central cross section. The longitudinal and lateral lengths are not limited to the same length as long as the longitudinal and lateral lengths are twice or more the interval between the first phase and the second phase. The massive first phase 104 is formed continuously with the uniform first phase in the lamellar structure.

In the solder ball 34, the average number of the massive first phases 104 in each frame 21 is preferably three or less. When the average number of the massive first phases 104 is three or less, it can be said that a uniform lamellar structure is formed in the vicinity of the surface of the solder ball 34. As shown in FIG. 3B, a massive first phase is not observed in the solder ball 34.

Figure 4B:
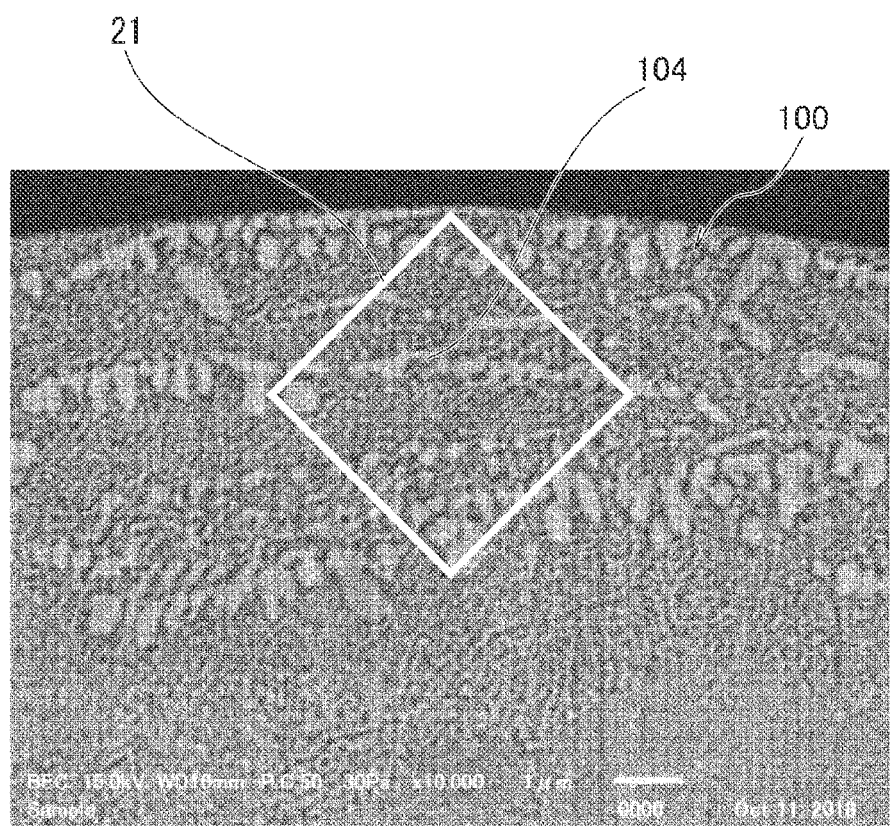
FIG. 4B A view showing a state of evaluating the uniformity in a conventional solder ball.

On the other hand, in the solder ball 100 of the conventional Au—Sn-based alloy shown in FIG. 4B, at least 30 massive first phases 104 were observed in the frame 21, and the average number of the massive first phases 104 in the four frames 21 was approximately 15, and thus exceeded three.

The solder ball 34 contains Sn of 19 mass % or more and 25 mass % or less, and contains one or more elements of Fe, Cr, Ni, Cu, Co, and Ti, and the balance contains Au as a main component. The balance may be composed of Au and inevitable impurities. Since the solder ball 34 contains the above elements, a lamellar structure without a non-uniform Au-rich phase is formed, and a good appearance without shrinkage cavities can be obtained.

The spherical diameter of the solder ball 34 is preferably 40 μm to 250 μm, and more preferably 50 μm to 250 μm. When the spherical diameter is 40 μm to 250 μm, the solder ball 34 having uniform spherical diameter accuracy can be manufactured.

When the solder ball 34 has a composition in which the concentration of Au is higher than that of Au-19 mass % Sn, the Au-rich phase is easily precipitated, and irregularities and shrinkage cavities are likely to be generated. In the case of a composition in which the concentration of Sn is less than 19 mass % and more than 25 mass %, it is difficult to obtain a uniform solidified structure because the liquidus temperature increases and the solid-liquid coexisting region is wide.

The solder ball 34 contains Sn of 19 mass % or more and 25 mass % or less, contains any one element of Fe, Cr, and Ni, and the balance contains Au as a main component. The balance may be composed of Au and inevitable impurities. In the solder ball 34, the concentration of Fe in the case of containing Fe is 0.1 ppm by mass or more and 10 ppm by mass or less, the concentration of Cr in the case of containing Cr is 0.1 ppm by mass or more and 100 ppm by mass or less, and the concentration of Ni in the case of containing Ni is 1 ppm by mass or more and 5,000 ppm by mass or less with respect to the entire solder ball 34.

When the concentrations of the elements are within the above range, the solder ball 34 can prevent the occurrence of shrinkage cavities and obtain good wettability. That is, since the solder ball 34 has a lamellar structure without a non-uniform Au-rich phase, a good appearance without shrinkage cavities can be obtained. When the concentration of each element is within the above range, since the oxide film on the surface of the solder ball 34 is reliably melted at the time of melting, resulting in good wettability. The reason why the required concentration range varies depending on each element of Fe, Cr, and Ni is considered to be due to the affinity between Au or Sn and Fe, Cr, or Ni at the time of forming solidified nuclei.

On the other hand, when the concentration of the element is less than the lower limit, the effect of preventing the precipitation of the Au-rich phase cannot be obtained. In addition, when the concentration of the element is more than the upper limit, the wettability of the solder ball decreases. The wettability is presumably affected by the oxide film on the surface of the solder ball. That is, as compared with the case where the concentration range is equal to or less than the upper limit, an oxide film formed when the concentration range is more than the upper limit may have a large thickness or may have a structure different from that of the oxide film formed when the concentration range is equal to or less than the upper limit although having the same thickness. When the concentration range is more than the upper limit, it is considered that the oxide film is hardly melted at the time of melting the solder ball, resulting in low wettability.

The concentration of Fe is preferably 0.1 ppm by mass or more and 5 ppm by mass or less. When the concentration of Fe is 0.1 ppm by mass or more and 5 ppm by mass or less, even better wettability can be obtained. When the concentration of Ni is 1 ppm by mass or more and 5,000 ppm by mass or less, the occurrence of shrinkage cavities can be prevented, and even better wettability can be obtained. When the concentration of Ni is 20 ppm by mass or more and ppm by mass or less, a solder ball having no irregularities or shrinkage cavities can be obtained, which is more preferable. When the concentration of Ni is 1,000 ppm by mass or more and 5,000 ppm by mass or less, a solder ball having no irregularities or shrinkage cavities is obtained, which is more preferable. When the concentration of Ni is 3,800 ppm by mass or less, higher productivity can be obtained. When the concentration of Ni is 1,300 ppm by mass or more and 2,500 ppm by mass or less, even better wettability can be obtained.

The solder ball 34 contains Sn of 19 mass % or more and 25 mass % or less, contains a combination of two or more elements of Fe, Cr, and Ni, and the balance contains Au as a main component. The balance may be composed of Au and inevitable impurities. In the solder ball 34, the concentration of Fe in the case of containing Fe is 0.1 ppm by mass or more and 10 ppm by mass or less, the concentration of Cr in the case of containing Cr is 0.1 ppm by mass or more and 100 ppm by mass or less, the concentration of Ni is in a range of 0 ppm by mass or more and 4,990 ppm by mass or less, and the total concentration of the combination of the elements with respect to the entire solder ball 34 is more than 0.1 ppm by mass and 5,000 ppm by mass or less. When the total concentration of the combination of the elements is less than the lower limit, the effect of preventing the precipitation of the Au-rich phase cannot be obtained. On the other hand, when the total concentration of the combination of the elements is more than 5,000 ppm by mass, the wettability of the solder ball decreases or the granulation properties deteriorate. The concentration of Ni may be in a range of 0 ppm by mass or more and 4,890 ppm by mass or less. The total concentration of the combination of the elements may be more than 0.1 ppm by mass and 500 ppm by mass or less. The concentration of Ni in this case may be in a range of 0 ppm by mass or more and 450 ppm by mass or less. When the total concentration of the combination of the elements is more than 0.1 ppm by mass and 500 ppm by mass or less, a solder ball having no irregularities or shrinkage cavities can be more reliably obtained, and even better wettability can be obtained.

(3) Concentration Analysis Method

A method for analyzing the element concentration will be described. The element concentration is separately analyzed by ICP-MS and ICP-OES depending on the concentration range. When the concentration range is less than 100 ppm by mass, the element concentration can be analyzed by inductively coupled plasma mass spectrometry (ICP-MS). When the concentration range is 100 ppm by mass or more, the element concentration can be analyzed by inductively coupled plasma optical emission spectrometer (ICP-OES).

(Regarding ICP-MS)

<Sample Pretreatment Method>

As the analyzer, (device model number: Agilent 8800) manufactured by Agilent Technologies, Inc. is used. The procedure of the pretreatment is as follows. A solder ball (0.1 g) is weighed, 20 ml of aqua regia (composition: hydrochloric acid and nitric acid are mixed at a ratio of 3:1) is added to the solder ball, and the mixture is heated to approximately 200° C. to be melted. After the molten solder is allowed to cool, the mixture is transferred into a volumetric flask (volume: 100 mL) made of polypropylene (hereinafter, referred to as "made of PP"), and the volume is adjusted to a constant volume with ultrapure water. For the decomposition container, a quartz glass beaker is used to avoid contamination with impurities.

<Analysis Method>

As an analysis method, a standard addition method is adopted. Specifically, 10 mL of the solution is placed in each of a plurality of PP volumetric flasks (volume: 100 mL), 2 mL of a solution obtained by diluting a single element standard solution of an element to be analyzed (Fe, Cr, Ni) to 100 μg/L is added stepwise to each PP volumetric flask, and then an extrapolated value when the addition amount is assumed to be 0 is taken as the analysis value of the target element based on the analysis value of each of the solutions whose volumes have been adjusted to a constant volume. As the single element standard solution, a reagent (Fe: 20247-2B, Cr: 08037-3B, Ni: 28577-2B) manufactured by Kanto Chemical Co., Inc. is used.

<Measurement>

In the ICP-MS analysis method, interference is caused by generated polyatomic ions, and the background increases. For example, 40Ar16O+ as an interference ion has a significant influence at m/z=56, which is the main peak of Fe, and 40Ar12C+ as an interference ion has a significant influence at m/z=52, which is the main peak of Cr. Therefore, the measurement is performed by cool plasma (output: 600 W) to suppress the influence of interference ions.

(Regarding ICP-OES)

<Sample Pretreatment Method>

As an analyzer, (device model number: iCAP 6500) manufactured by Thermo Fisher Scientific Inc. is used. The procedure of the pretreatment is as follows. A solder ball (1.0 g) is weighed, 20 mL of aqua regia (composition: hydrochloric acid and nitric acid are mixed at a ratio of 3:1) is added to the solder ball, and the mixture is heated to approximately 200° C. to be melted. After the molten solder is allowed to cool, the mixture is transferred into a volumetric flask (volume: 100 mL) made of borosilicate glass (hereinafter, referred to as "made of glass"), and the volume is adjusted to a constant volume with aqua regia which has been heated and degassed.

<Analysis Method>

As an analysis method, a standard addition method is adopted. Specifically, 10 mL of the solution is placed in each of a plurality of glass volumetric flasks (volume: 100 mL), 0.1 mL of a single element standard solution (1,000 μg/L) of an element to be analyzed (Fe, Cr, Ni) is added stepwise to each PP volumetric flask, and then an extrapolated value when the addition amount is assumed to be 0 is taken as the analysis value of the target element based on the analysis value of each of the solutions whose volumes have been adjusted to a constant volume. As the single element standard solution, a reagent (Fe: 20247-2B, Cr: 08037-3B, Ni: 28577-2B) manufactured by Kanto Chemical Co., Inc. is used.

<Measurement>

The wavelengths of Fe: 259.940 nm, Cr: 267.716 nm, and Ni: 341.476 nm are measured by ICP-OES.

(4) Manufacturing Method (Solder Ball)

Figure 5:
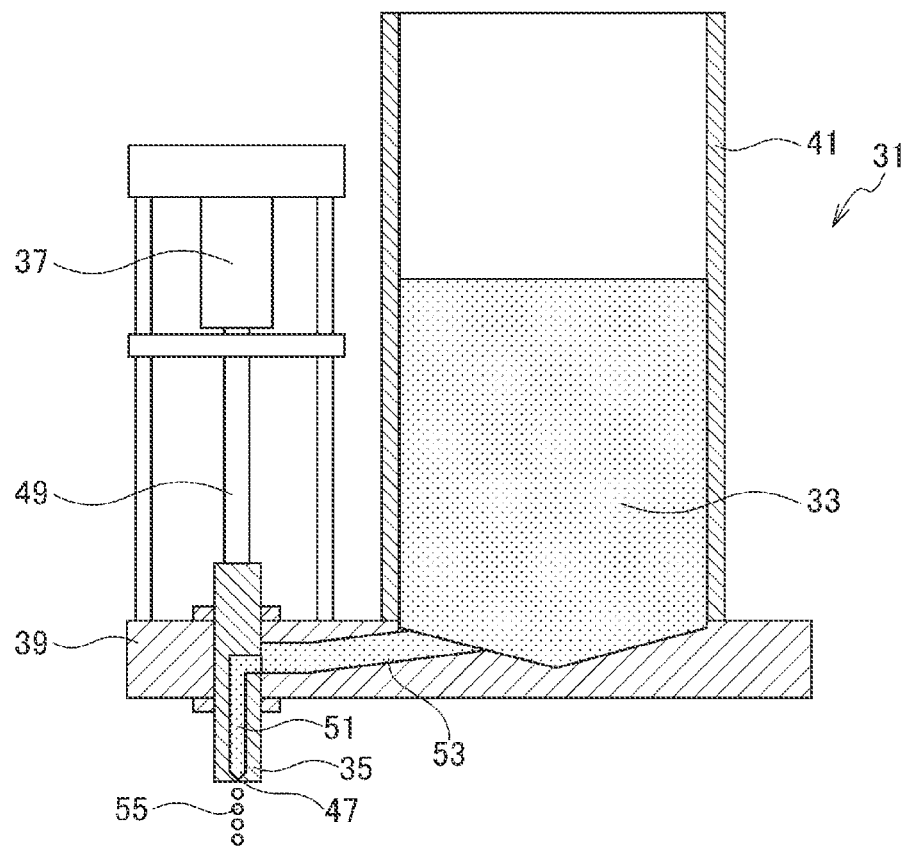
FIG. 5 A cross-sectional view schematically showing a manufacturing apparatus used when solder balls are manufactured by a uniform droplet spraying method.

The solder ball 34 is preferably formed by a uniform droplet splay method (UDS method) in order to obtain uniform spherical diameter accuracy. An apparatus for manufacturing the solder ball 34 to be used by the UDS method will be described with reference to FIG. 5. A manufacturing apparatus 31 shown in FIG. 5 includes a nozzle 35 that causes a molten solder 33 to flow downward, a vibration device 37 that vibrates the nozzle 35, a nozzle frame 39 that slidably holds the nozzle 35, and a solder storage tank 41.

The nozzle 35 has an outlet 47 in the lower portion thereof, and is slidably held by the nozzle frame 39. The nozzle 35 is vertically slidable while being held by the nozzle frame 39. The nozzle 35 is connected to the vibration device 37 via a steel connecting rod 49. The vibration device 37 includes a generally used piezoelectric element (not shown) that vibrates in the thickness direction. The vibration direction of the nozzle 35 by the vibration device 37 coincides with the sliding direction of the nozzle 35 held by the nozzle frame 39.

The nozzle 35 has a cylindrical shape, and the outlet 47 is opened at a lower end of the cylinder. The nozzle frame 39 can hold the nozzle 35 slidably in the vertical direction by disposing the nozzle 35 in a cylindrical vertical opening having the same diameter as that of the cylindrical portion of the nozzle 35. The vibration device 37, the connecting rod 49, and the nozzle 35 are disposed in the vertical direction, and the nozzle 35 vibrates in the vertical direction by the vibration device 37. The vibration frequency is set to 10 to 50 kHz.

In the solder storage tank 41, the molten solder 33 is held at a temperature higher than the melting point by a predetermined temperature. The solder storage tank 41 includes a heating device with a band heater wound thereon, and the temperature of the molten solder 33 can be maintained at a temperature higher than its melting point by 100° C. or more.

The nozzle 35 has a nozzle path 51. The distal end of the nozzle path 51 is connected to the outlet 47 in the lower portion of the nozzle. The base end of the nozzle path 51 is connected to the distal end of the frame path 53 of the nozzle frame 39. The base end of the frame path 53 is connected to the bottom portion of the solder storage tank 41. The molten solder 33 stored in the solder storage tank 41 passes through the frame path 53 and the nozzle path 51 and flows out from the outlet 47. The manufacturing apparatus 31 causes the molten solder 33 to flow out from the outlet 47 while vibrating the nozzle 35 by the vibration device 37, thereby separating the flowed molten solder 33 into droplets 55.

The size of the solder ball 34 to be manufactured is determined by the diameter of the outlet 47, the outflow speed of the molten solder 33 from the outlet 47, and the vibration frequency of vibration to be applied. In addition, the outflow speed of the molten solder 33 from the outlet 47 can be adjusted by the head difference between the liquid level in the solder storage tank 41 and the outlet 47. In the case of manufacturing the solder ball 34 having a spherical diameter of 100 μm, the diameter of the outlet 47 may be set to approximately 53 to 57 μm, the head difference between the liquid level in the solder storage tank 41 and the outlet 47 may be set to approximately 0.3 to 0.4 MPa, and the vibration frequency of the nozzle vibration may be selected in a range of 3.0 to 4.0 kHz.

When the nozzle 35 is vibrated by the vibration device 37, the nozzle frame 39 does not vibrate, and only the nozzle 35 vibrates. Therefore, the manufacturing apparatus 31 has no loss of vibration energy, and thus the droplet size becomes uniform, and consequently, the solder ball 34 having a highly accurate spherical diameter can be generated.

(Joint Structure)

Figure 6A:
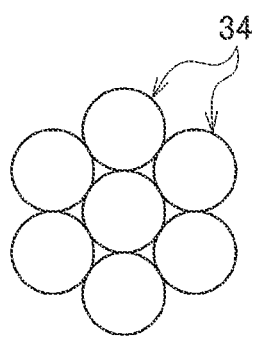
FIG. 6A A plan view showing an example in which the solder balls according to the first embodiment are disposed in a close-packed manner.

Next, a procedure for joining the LED chip 12 to the ceramic substrate 16 will be described. First, the solder balls 34 are disposed and temporarily fixed on the electrodes 22 and 24 of the LED chip 12. As shown in FIG. 6A, the solder balls 34 may be disposed so as to be close-packed. When the solder balls 34 are disposed so as to be close-packed, the interval between the solder balls 34 is the spherical diameter R1 of the solder ball 34. The regions on the electrodes 22 and 24 where the solder balls 34 are disposed are appropriately selected so that the thickness of the joint portion 14 after joining falls within a desired range.

In order to mount the solder balls 34 on the electrodes 22 and 24 of the LED chip 12 as described above, a bump forming method of collectively mounting a plurality of solder balls 34 is effective (for example, JP 2012-256748 A). The bump forming method uses a ball arrangement plate (not shown) that adsorbs and holds at least one solder ball group of the LED chip 12. In the ball arrangement plate, suction holes are formed at all positions corresponding to the positions where the solder balls 34 are disposed. After the solder balls 34 are adsorbed and held on the ball arrangement plate, the ball arrangement plate is conveyed to the joining stage and disposed on the electrodes 22 and 24 of the LED chip 12 coated with the flux. The solder balls 34 are adhered to the surfaces of the electrodes 22 and 24 by the adhesive force of the flux. According to this bump forming method, since the uniformly formed solder balls 34 can be collectively disposed at predetermined positions, a ball bump having high reliability can be easily and efficiently formed.

Figure 6B:
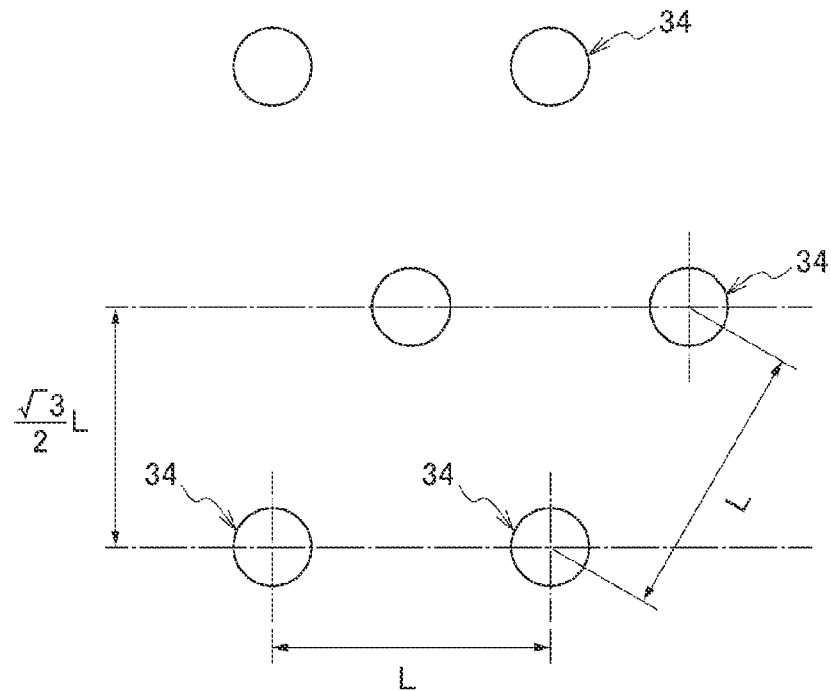
FIG. 6B A plan view showing an example in which the solder balls according to the first embodiment are disposed at an interval L.

As shown in FIG. 6B, the solder balls 34 may be disposed on the electrodes 22 and 24 at an interval L represented by the following equation (1).

$$L=\sqrt{(2R_1^3/3t)} \qquad (1)$$

In the example shown in FIG. 6B, the solder balls 34 are disposed in a zigzag shape. As shown in FIG. 6B, the linear distance between the adjacent solder balls 34 is L. The interval between the solder ball rows disposed linearly at the interval L is $(L/2)\cdot\sqrt{3}$.

Figure 7A:
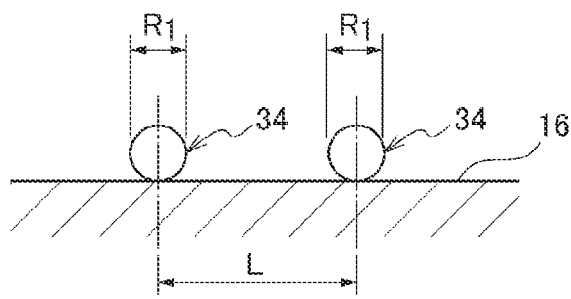
FIG. 7A A schematic end view showing a state of the solder ball according to the first embodiment before melting.
Figure 7B:
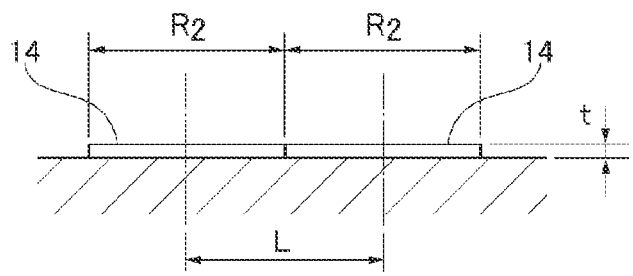
FIG. 7B A schematic end view showing a state of the solder ball according to the first embodiment after melting.

FIG. 7A shows a positional relationship between the solder balls 34 before melting. FIG. 7B shows a positional relationship between the joint portions 14 after melting. The solder balls 34 are disposed at the interval L before melting. The solder ball 34 spreads by melting, and becomes a joint portion 14 having a diameter R2 and a thickness t. By setting the interval L between the solder balls 34 to the value represented by the above equation, it is possible to form the joint portion 14 which has a desired thickness t and in which adjacent solder balls 34 spread and come in contact with each other to be integrated. That is, the thickness t can be further reduced as compared with the case where solder balls are close-packed.

Although FIG. 6B shows an example in which the solder balls 34 are disposed in a zigzag shape, the solder balls 34 may be disposed in a lattice shape or a straight line. As described above, the bump forming method can also be used when the solder balls 34 are disposed in a zigzag shape or a lattice shape at a predetermined interval.

After the ball bumps are formed on the electrodes 22 and 24 as described above, the LED chip 12 is turned over and placed on the ceramic substrate 16 in a manner that the first joint surface, which is the surface of the electrodes 22 and 24, faces the second joint surface, which is the surface of the electrodes 26 and 28. Then, the LED chip 12 and the ceramic substrate 16 are aligned so that the electrodes 22 and 24 and the electrodes 26 and 28 correspond to each other. By heating in this state, the solder balls 34 are melted, cooled and solidified to form the joint portion 14, and the electrodes 22 and 24 and the electrodes 26 and 28 are electrically connected.

After the ball bumps are formed on the electrodes 22 and 24, the LED chip 12 may be heated to reflow the solder balls 34. The solder balls 34 spread over the electrodes 22 and 24 by reflow, and become the solidified joint portion 14 by cooling. The LED chip 12 is turned over and placed on the ceramic substrate 16, and the LED chip 12 and the ceramic substrate 16 are aligned so that the electrodes 22 and 24 and the electrodes 26 and 28 correspond to each other. This is heated to melt the joint portion 14 again, then cooled and solidified, thereby electrically connecting the electrodes 22 and 24 and the electrodes 26 and 28. In this case, since the joint portion 14 spreads in advance, the electrodes 22 and 24 and the electrodes 26 and 28 can be more reliably connected, and generation of voids and the like can be more reliably reduced.

(5) Action and Effect

In the LED package 10 formed as described above, the thickness t of the joint portion 14 is 50 μm or less and the LED chip 12 and the ceramic substrate 16 are close to each other, thereby allowing the heat generated in the LED chip 12 to be efficiently transferred to the ceramic substrate 16. Therefore, the LED package 10 can enhance the heat dissipation, and thus the quality of the semiconductor light emitting device 11 can be improved. The thickness t of the joint portion 14 is preferably less than 35 μm, and more preferably 20 μm or less.

Since the joint portion 14 is formed using the solder balls 34, the thickness t can be 50 μm or less, and the amount of Au used can be reduced. In addition, the amount of the solder ball 34 used for the joint portion 14 of the present embodiment can be reduced as compared with the conventional solder paste, and the yield can be improved as compared with the conventional sheet-shaped brazing material. Therefore, the LED package 10 can reduce the amount of Au used.

In the solder ball 34, the average number of the massive first phases 104 in each frame 21 is three or less, and a uniform lamellar structure is formed in the vicinity of the surface, and thus a good appearance without shrinkage cavities can be obtained.

In the solder ball 34, a uniform lamellar structure is formed by containing the above element in a predetermined concentration range, and the appearance is in a good state without shrinkage cavities, and thus reliability can be improved. By forming the solder balls by the UDS method, the solder ball 34 having uniform spherical diameter accuracy can be obtained. By joining using the solder balls 34 having uniform spherical diameter accuracy, the reliability of the LED package 10 can be further improved.

The solder ball 34 can obtain good wettability by having a concentration of Fe of 10 ppm by mass or less in the case of containing Fe, a concentration of Cr of 100 ppm by mass or less in the case of containing Cr, and a concentration of Ni of 5,000 ppm by mass or less in the case of containing Ni.

Since the solder spreads well in the joint portion 14, generation of voids can be reduced. Since the joint portion 14 can more favorably electrically connect the electrodes 22 and 24 and the electrodes 26 and 28, the LED package 10 can enhance the electrical conductivity and the thermal conductivity, thereby further improving the quality. Such an LED package 10 can be applied to a light source such as an automobile headlight requiring high luminance.

2. Second Embodiment

Figure 8:
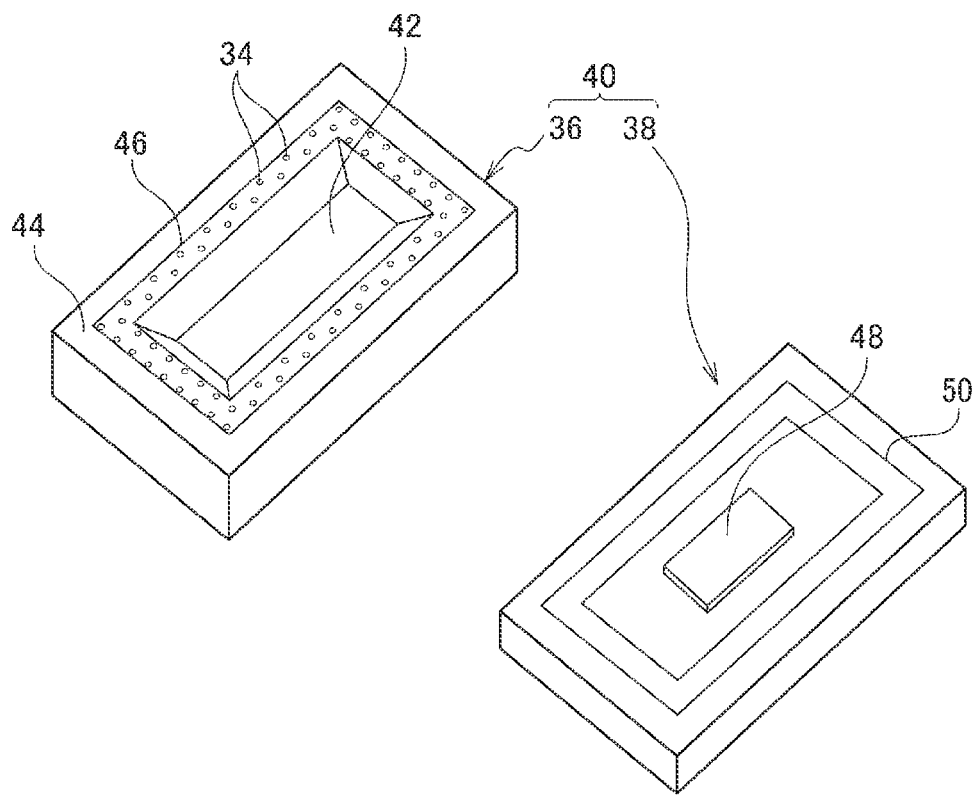
FIG. 8 A perspective view showing a sealing package according to a second embodiment.

Next, a second embodiment of the present invention will be described. A sealing package 40 as a joint structure shown in FIG. 8 includes a lid 36 as a first structure and a base 38 as a second structure. The lid 36 is a flat plate-shaped member, and has a container portion 42 at the center portion thereof and a flange portion 44 formed so as to surround the container portion 42. The container portion 42 has a surface formed in a concave shape in the thickness direction. In the flange portion 44, a conductive layer 46 formed of a conductive material is disposed, and solder balls 34 are disposed on the conductive layer 46.

The base 38 is a flat plate-shaped member, an electronic device 48 is fixed to the center portion thereof, and a conductive layer 50 formed of a conductive material is formed so as to surround the electronic device 48. The electronic device 48 is, for example, an SAW filter, an FBAR filter, or a crystal resonator.

Figure 9:
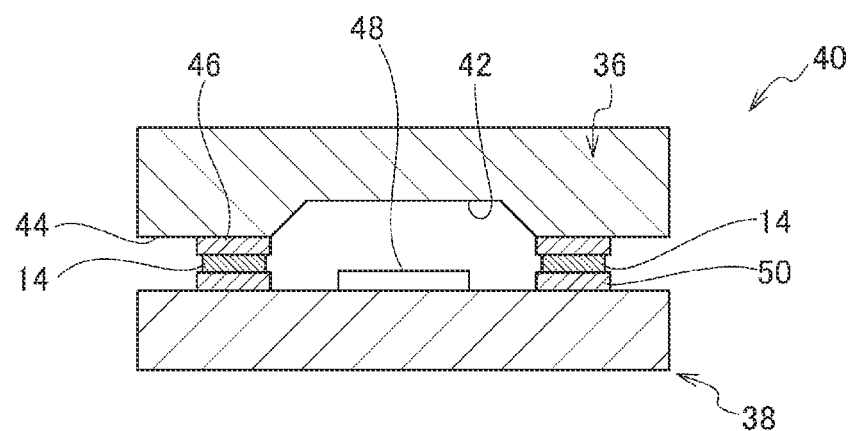
FIG. 9 A partial end view showing a sealing package according to the second embodiment.

The lid 36 is turned over and placed on the base 38 with the surface of the conductive layer 46 as the first joint surface facing the surface of the conductive layer 50 as the second joint surface. The lid 36 and the base 38 are aligned such that the conductive layer 46 and the conductive layer 50 correspond to each other. By heating in this state, the solder balls 34 are melted, cooled and solidified to form the joint portion 14, and the conductive layer 46 and the conductive layer 50 are electrically connected (FIG. 9). The electronic device 48 is sealed in a space surrounded by the container portion 42 and the surface of the base 38.

By setting the thickness t of the joint portion 14 to 50 μm or less, thermal conductivity can be improved, so that quality can be improved. In addition, since generation of voids is reduced by forming the joint portion 14 using the solder ball 34, hermeticity can be enhanced. Whereby, the quality of the sealing package 40 can be improved and the same effects as those of the first embodiment can be obtained.

In the case of the second embodiment, the case where the container portion 42 is provided on the lid 36 has been described, but the present invention is not limited thereto. The container portion and the flange portion may be provided on the base. In this case, the lid is a flat member in which the container portion is not formed, and a lid in which a conductive layer is formed at a position corresponding to the conductive layer formed on the flange portion of the base can be used.

3. Third Embodiment

Next, a third embodiment of the present invention will be described. In the third embodiment, a method for manufacturing a joint structure, including disposing solder balls on the first joint surface using a solder jet method will be described. Although not shown, the solder jet method is a method of loading solder balls in a microtube such as a capillary, melting the solder balls by irradiation with a laser beam, and simultaneously extruding the solder balls with an inert gas or the like to temporarily fix the solder balls to the first joint surface. According to the solder jet method, since the solder ball can be temporarily fixed directly to the first joint surface without using the flux, it is possible to reduce the occurrence of defects caused by the flux, for example, the generation of voids and joint defects. The solder jet method may be applied in combination with the bump forming method.

Figure 10A:
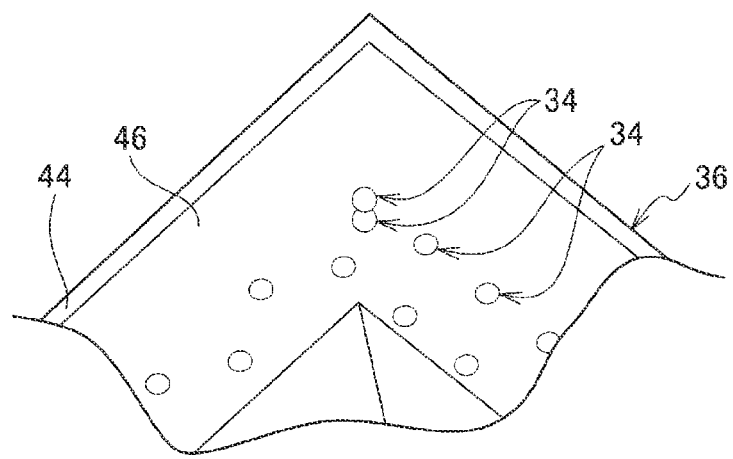
FIG. 10A A perspective view showing an arrangement example of solder balls in a corner portion according to a third embodiment.

According to the solder jet method, solder balls can be further stacked on the solder balls temporarily fixed one by one at a predetermined interval on the first joint surface. For example, as shown in FIG. 10A, in the corner portion, a plurality of the solder balls 34 can be temporarily fixed on the corner portion of the conductive layer 46 in a state of being stacked on the surface of the conductive layer 46 in the height direction. In a place where a plurality of the solder balls 34 are stacked, the solder spreads in a wider range than other places. Therefore, by staking a plurality of the solder balls 34, an extension portion 60 can be partially formed in the joint portion 14 as shown in FIG. 10B.

Figure 10B:
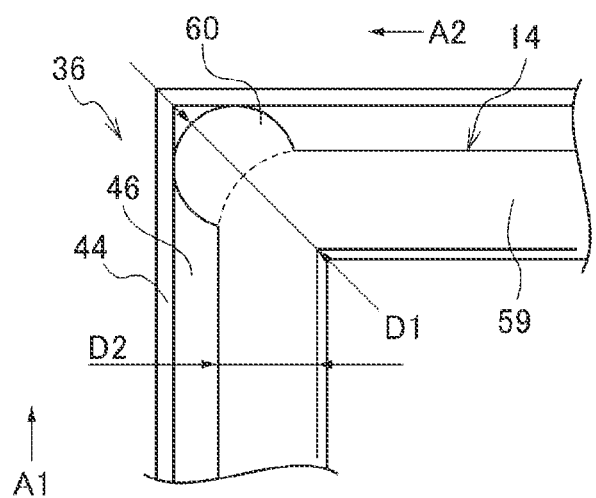
FIG. 10B A schematic view showing a joint portion in a corner portion according to the third embodiment.

The joint portion 14 shown in FIG. 10B has a base joint portion 59 and the extension portion 60. The base joint portion 59 and the extension portion 60 are integrally formed. The base joint portion 59 is formed by disposing solder balls 34 one by one in the height direction at a predetermined interval. The joint area per unit length in the longitudinal direction (arrows A1 and A2 in FIG. 10B) of the joint portion 14 is constant. The base joint portion 59 has a constant width length. The extension portion 60 has a larger joint area than that of the base joint portion 59. The extension portion 60 is provided at a corner portion where the base joint portion 59 is bent.

A broken line in FIG. 10B is an imaginary line indicating an outer edge of the corner portion of the base joint portion 59 in a case where it is assumed that the extension portion 60 is not formed. Note that, in the present specification, the term "constant" is not limited to a case of being completely constant, and includes a range to some extent, for example, a range that can be said to be a manufacturing error.

The extension portion 60 is formed continuously with the outer edge of the corner portion of the joint portion 14 and has a contour extending to the outside of the corner portion. The contour shown in FIG. 10B has an arc shape, but the present invention is not limited thereto. A length D1 from an inner edge of the joint portion 14 to an outer contour of the extension portion 60 in the corner portion is longer than a width D2 of the base joint portion. The base joint portion 59 defined by the imaginary line has a constant joint area per unit length, and does not reach a region outside the flange portion 44. On the other hand, in the joint portion 14 according to the present modified example, the joint area is increased by providing the extension portion 60, and the extension portion 60 sufficiently reaches the region outside the flange portion 44. Therefore, the mechanical strength can be improved, and the electrical conductivity and the thermal conductivity can be further improved.

FIG. 10A shows a case where two solder balls 34 are stacked, but the present invention is not limited thereto, and three or more solder balls may be stacked. In addition, FIG. 10B shows the corner portion where the base joint portion 59 is bent at a right angle, but the present invention is not limited thereto. The angle at which the base joint portion 59 is bent at the corner portion can be optionally selected.

Figure 11:
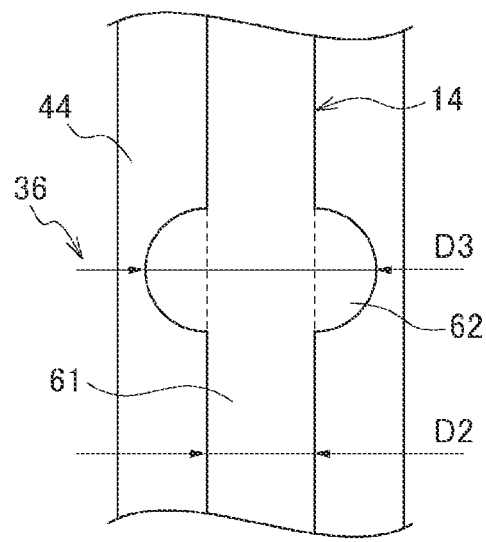
FIG. 11 A schematic view showing a linear joint portion according to a modified example of the third embodiment.

The extension portion may be formed at a regular interval in a region other than the corner portion, for example, in a linear portion as shown in FIG. 11. The joint portion 14 shown in FIG. 11 has a linear base joint portion 61 and an extension portion 62 at a predetermined position of the base joint portion 61. The base joint portion 61 and the extension portion 62 are integrally formed. A broken line in FIG. 11 is an imaginary line indicating an outer edge of the base joint portion 61 in a case where it is assumed that the extension portion 62 is not formed. The base joint portion 61 has a constant width length and a constant joint area per unit length in the longitudinal direction. The extension portion 62 is formed continuously with the outer edge of the linear portion of the base joint portion 61 and has a contour extending outward in the width direction. The contour shown in FIG. 11 has an arc shape, but the present invention is not limited thereto. A width D3 of the extension portion 62 is longer than a width D2 of the base joint portion 61. In the joint portion 14 according to the present modified example, the extension portion is provided at a regular interval, thereby increasing the joint area, improving the mechanical strength, and further improving the electrical conductivity and the thermal conductivity.

4. Modified Example

The present invention is not limited to the above embodiment, and can be appropriately changed within the scope of the gist of the present invention. For example, in the case of the first embodiment, the case where the first structure is applied to an LED chip has been described, but the present invention is not limited thereto, and can also be applied to a laser diode.

In the case of the first embodiment, the case where the joint portion 14 is formed using the solder ball 34 in which the above element or the above combination of the elements is added has been described, but the present invention is not limited thereto. The joint portion 14 may be formed using a solder ball containing Sn of 19 mass % or more and 25 mass % or less and Au as a main component, in which the above element or the above combination of the elements is not added.

5. Examples

Hereinafter, the present invention will be described in detail based on the present Examples, but this shows an example of the present invention, and the present invention is not limited by the Examples at all.

(Sample)

Solder balls shown in Table 1 were prepared by the procedure described in "(3) Manufacturing method (solder ball)", and the appearance and wettability were evaluated. In the manufacturing of the solder balls, first, Au, Sn, and additional elements were weighed so as to have the composition shown in Table 1, and an ingot was prepared by high-frequency melting. The ingot was placed in a solder storage tank, the solder storage tank was heated to 300 to 400° C., and the frequency of the piezo element was adjusted to 10 to 50 kHz. The inside of the solder storage tank was set to an atmosphere of $N_2$-5 vol % $H_2$ and a positive pressure, and 10,000 or more solder balls were manufactured. Then, 50 solder balls were freely selected and evaluated as follows. The concentration of each solder ball was analyzed by ICP-MS or ICP-OES.

(Evaluation Method)

The manufactured solder balls were evaluated in terms of spherical diameter accuracy, appearance, and wettability. The spherical diameter accuracy was evaluated by measuring the maximum values in the X direction and the Y direction using a microscope, and evaluating the difference (tolerance) between the maximum value and the minimum value. A case where the tolerance was within 10 μm when the spherical diameter was 100 μm or less, a case where the tolerance was within 15 μm when the spherical diameter was more than 100 μm and 200 μm or less, and a case where the tolerance was within 25 μm when the spherical diameter was more than 200 μm were evaluated as 2 points, and other cases were evaluated as 0 points. All the manufactured solder balls having a spherical diameter of 40 μm or more result in a tolerance within the above tolerance.

Figure 12A:
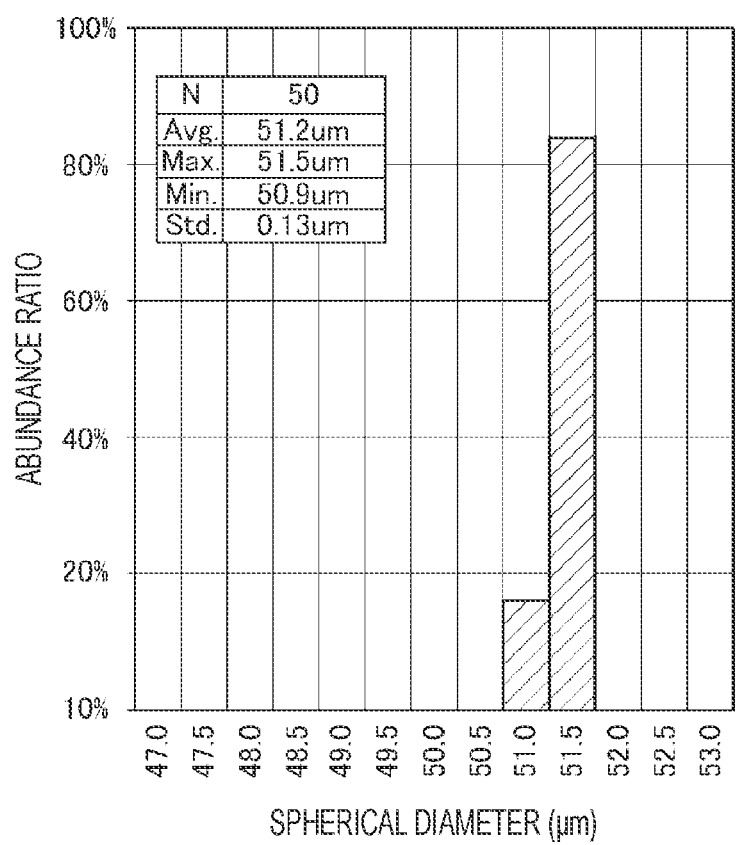
FIG. 12A A graph showing a spherical diameter distribution of solder balls having a spherical diameter of 50 μm.
Figure 12B:
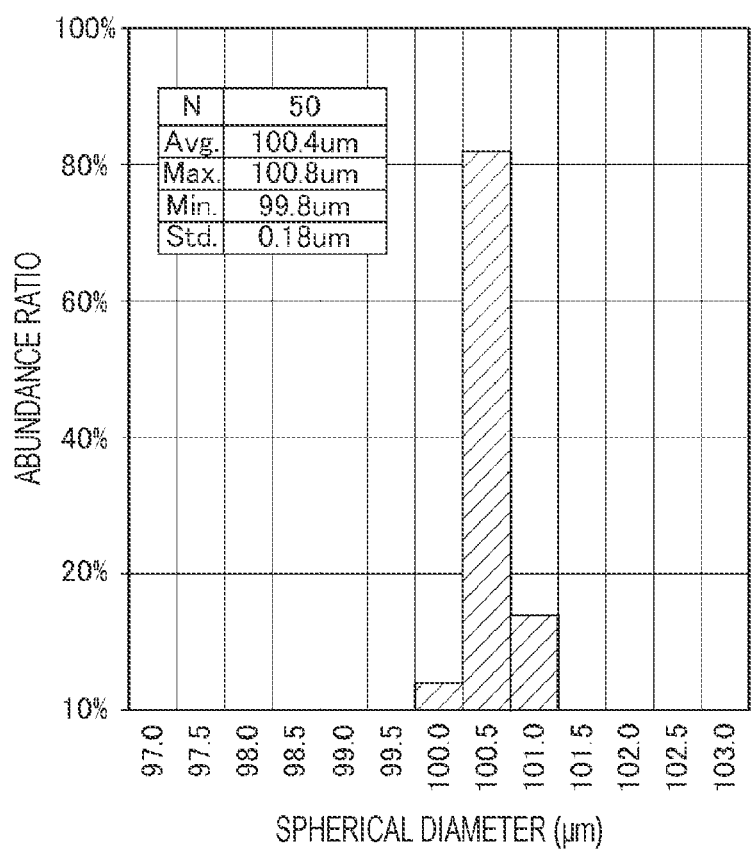
FIG. 12B A graph showing a spherical diameter distribution of solder balls having a spherical diameter of 100 μm.

As a representative example, the spherical diameter distributions of solder balls having a spherical diameter of 50 μm and 100 μm are shown in FIGS. 12A and 12B. In FIGS. 12A and 12B, the vertical axis indicates the abundance ratio, and the horizontal axis indicates the spherical diameter (μm). FIG. 12A shows the result of the spherical diameter of 50 μm, and FIG. 12B shows the result of the spherical diameter of 100 μm. As a result of manufacturing solder balls having a spherical diameter of 50 μm, the average spherical diameter was 51.2 μm, the maximum spherical diameter was 51.5 μm, the minimum spherical diameter was 50.9 μm, and the standard deviation was 0.13 μm. As a result of manufacturing solder balls having a spherical diameter of 100 μm, the average spherical diameter was 100.4 μm, the maximum spherical diameter was 100.8 μm, the minimum spherical diameter was 99.8 μm, and the standard deviation was 0.18 μm. The above results show that solder balls having an extremely highly accurate spherical diameter were obtained by the UDS method.

The appearance was evaluated by observing irregularities and shrinkage cavities on the ball surface with a microscope. A case where there was no irregularities or shrinkage cavities was evaluated as 2 points, a case where there was one or more solder balls having irregularities was evaluated as 1 point, and a case where there was one or more solder balls having shrinkage cavities was evaluated as 0 points. The wettability was evaluated by the ratio of the area of spread when solder balls were placed on a copper plate without using a flux and heated at 320° C. for 1 minute in a nitrogen atmosphere to the projected area of the original solder balls (spreading ratio). A case where the spreading ratio of all the solder balls was less than 150% was evaluated as 0 points, a case where the spreading ratio was 150% or more and less than 180% was evaluated as 1 point, a case where the spreading ratio was 180% or more and less than 200% was evaluated as 2 points, a case where the spreading ratio was 200% or more and less than 210% was evaluated as 3 points, and a case where the spreading ratio was 210% or more was evaluated as 4 points. The above results are shown in Table 1.

TABLE 1

| | No. | AuSn composition (mass %) | Fe content (ppm by mass) | Cr content (ppm by mass) | Ni content (ppm by mass) | Total concentration of added element (ppm by mass) | Spherical diameter (μm) | Tolerance (μm) | Appearance | Wettability |
|---|---|---|---|---|---|---|---|---|---|---|
| Example | 1 | Au-19Sn | 0.1 | 0 | 0 | 0.1 | 100 | 2 | 2 | 3 |
| | 2 | Au-19Sn | 1 | 0 | 0 | 1 | 100 | 2 | 2 | 3 |
| | 3 | Au-22Sn | 1 | 0 | 0 | 1 | 50 | 2 | 2 | 3 |
| | 4 | Au-22Sn | 1 | 0 | 0 | 1 | 125 | 2 | 2 | 3 |
| | 5 | Au-22Sn | 1 | 0 | 0 | 1 | 200 | 2 | 2 | 3 |
| | 6 | Au-22Sn | 1 | 0 | 0 | 1 | 250 | 2 | 2 | 3 |
| | 7 | Au-19Sn | 5 | 0 | 0 | 5 | 100 | 2 | 2 | 3 |

TABLE 1-continued

|  | No. | AuSn composition (mass %) | Fe content (ppm by mass) | Cr content (ppm by mass) | Ni content (ppm by mass) | Total concentration of added element (ppm by mass) | Spherical diameter (μm) | Tolerance (μm) | Appearance | Wettability |
|---|---|---|---|---|---|---|---|---|---|---|
|  | 8 | Au-19Sn | 10 | 0 | 0 | 10 | 100 | 2 | 2 | 2 |
|  | 9 | Au-22Sn | 0 | 0.1 | 0 | 0.1 | 100 | 2 | 2 | 2 |
|  | 10 | Au-25Sn | 0 | 20 | 0 | 20 | 50 | 2 | 2 | 2 |
|  | 11 | Au-25Sn | 0 | 20 | 0 | 20 | 125 | 2 | 2 | 2 |
|  | 12 | Au-25Sn | 0 | 20 | 0 | 20 | 200 | 2 | 2 | 2 |
|  | 13 | Au-25Sn | 0 | 20 | 0 | 20 | 250 | 2 | 2 | 2 |
|  | 14 | Au-22Sn | 0 | 50 | 0 | 50 | 100 | 2 | 2 | 2 |
|  | 15 | Au-22Sn | 0 | 100 | 0 | 100 | 100 | 2 | 2 | 2 |
|  | 16 | Au-20Sn | 0 | 0 | 1 | 1 | 100 | 2 | 1 | 3 |
|  | 17 | Au-24Sn | 0 | 0 | 20 | 20 | 50 | 2 | 2 | 3 |
|  | 18 | Au-24Sn | 0 | 0 | 20 | 20 | 125 | 2 | 2 | 3 |
|  | 19 | Au-24Sn | 0 | 0 | 20 | 20 | 200 | 2 | 2 | 3 |
|  | 20 | Au-24Sn | 0 | 0 | 20 | 20 | 250 | 2 | 2 | 3 |
|  | 21 | Au-20Sn | 0 | 0 | 50 | 50 | 100 | 2 | 2 | 3 |
|  | 22 | Au-20Sn | 0 | 0 | 100 | 100 | 100 | 2 | 1 | 3 |
|  | 23 | Au-20Sn | 0 | 0 | 500 | 500 | 100 | 2 | 1 | 3 |
|  | 24 | Au-22Sn | 0 | 0 | 1000 | 1000 | 125 | 2 | 2 | 3 |
|  | 25 | Au-22Sn | 0 | 0 | 1300 | 1300 | 125 | 2 | 2 | 4 |
|  | 26 | Au-22Sn | 0 | 0 | 2000 | 2000 | 125 | 2 | 2 | 4 |
|  | 27 | Au-22Sn | 0 | 0 | 2500 | 2500 | 125 | 2 | 2 | 4 |
|  | 28 | Au-22Sn | 0 | 0 | 3800 | 3800 | 125 | 2 | 2 | 3 |
|  | 29 | Au-22Sn | 0 | 0 | 5000 | 5000 | 125 | 2 | 2 | 3 |
|  | 30 | Au-24Sn | 0.1 | 1 | 0 | 1.1 | 125 | 2 | 2 | 3 |
|  | 31 | Au-24Sn | 10 | 1 | 1 | 12 | 125 | 2 | 2 | 3 |
|  | 32 | Au-20Sn | 0 | 30 | 30 | 60 | 125 | 2 | 2 | 3 |
|  | 33 | Au-20Sn | 0 | 100 | 200 | 300 | 40 | 2 | 2 | 2 |
|  | 34 | Au-20Sn | 0 | 50 | 450 | 500 | 50 | 2 | 2 | 3 |
|  | 35 | Au-22Sn | 5 | 0 | 20 | 25 | 200 | 2 | 2 | 3 |
|  | 36 | Au-22Sn | 10 | 0 | 10 | 20 | 250 | 2 | 2 | 3 |
|  | 37 | Au-22Sn | 1 | 3 | 6 | 10 | 100 | 2 | 2 | 3 |
|  | 38 | Au-22Sn | 0.1 | 1 | 1 | 2.1 | 100 | 2 | 2 | 3 |
|  | 39 | Au-22Sn | 0 | 0.1 | 20 | 20.1 | 125 | 2 | 2 | 3 |
| Comparative Example | 1 | Au-19Sn | 0 | 0 | 0 | 0 | 100 | 2 | 0 | 2 |
|  | 2 | Au-19Sn | 20 | 0 | 0 | 20 | 100 | 2 | 1 | 0 |
|  | 3 | Au-22Sn | 0 | 0 | 0 | 0 | 100 | 2 | 0 | 2 |
|  | 4 | Au-22Sn | 0 | 120 | 0 | 120 | 100 | 2 | 1 | 0 |
|  | 5 | Au-20Sn | 0 | 0 | 0 | 0 | 100 | 2 | 0 | 2 |
|  | 6 | Au-20Sn | 0 | 0 | 5100 | 5100 | 100 | 2 | 1 | 0 |

(Evaluation Results)

In Examples Nos. 1 to 8, since the joint portion contains any one element of Fe, Cr, and Ni and the concentration of Fe in the case of containing Fe is 0.1 ppm by mass or more and 10 ppm by mass or less with respect to the entire solder ball, solder balls having no irregularities or shrinkage cavities and having good wettability were obtained. In Examples Nos. 1 to 7, since the concentration of Fe is 0.1 ppm by mass or more and 5 ppm by mass or less, even better results regarding wettability were obtained.

In Examples Nos. 9 to 15, since the joint portion contains any one element of Fe, Cr, and Ni and the concentration of Cr in the case of containing Cr is 0.1 ppm by mass or more and 100 ppm by mass or less with respect to the entire solder ball, solder balls having no irregularities or shrinkage cavities and having good wettability were obtained.

In Examples Nos. 16 to 29, since the joint portion contains any one element of Fe, Cr, and Ni and the concentration of Ni in the case of containing Ni is 1 ppm by mass or more and 5,000 ppm by mass or less with respect to the entire solder ball, solder balls having no shrinkage cavities and having even better wettability were obtained. In Examples Nos. 17 to 21, the concentration of Ni is 20 ppm by mass or more and 50 ppm by mass or less and in Examples Nos. 24 to 29, the concentration of Ni is 1,000 ppm by mass or more and 5,000 ppm by mass or less, and thus, solder balls having no appearance defect due to irregularities and shrinkage cavities were obtained. In Examples Nos. 25 to 27, since the concentration of Ni is 1,300 ppm by mass or more and 2,500 ppm by mass or less, even better results regarding wettability were obtained.

In Examples Nos. 30 to 39, since the joint portion contains a combination of two or more elements of Fe, Cr, and Ni, the concentration of each of Fe and Cr among the elements is in the above concentration range, the concentration of Ni is in a range of 0 ppm by mass or more and 4,990 ppm by mass or less, and the total concentration of the combination of the elements is more than 0.1 ppm by mass and 5,000 ppm by mass or less with respect to the entire solder ball, solder balls having no irregularities or shrinkage cavities and having good wettability were obtained.

On the other hand, in Comparative Examples Nos. 1, 3, and 5, since neither of Fe, Cr, nor Ni is contained, shrinkage cavities occurred. In Comparative Examples Nos. 2 and 4, since the concentrations of Fe and Cr are more than the upper limit, the wettability was deteriorated. In Comparative Example No. 6, the concentration of Ni is more than the upper limit, and uniform ball granulation was not possible.

REFERENCE SIGNS LIST

10: LED PACKAGE
11: SEMICONDUCTOR LIGHT EMITTING DEVICE (JOINT STRUCTURE)
12: LED CHIP (FIRST STRUCTURE)
14: JOINT PORTION
16: CERAMIC SUBSTRATE (SECOND STRUCTURE)
22, 24: ELECTRODE
26, 28: ELECTRODE
34: SOLDER BALL
36: LID (FIRST STRUCTURE)
38: BASE (SECOND STRUCTURE)
40: SEALING PACKAGE (JOINT STRUCTURE)
42: CONTAINER PORTION
44: FLANGE PORTION
46: CONDUCTIVE LAYER
48: ELECTRONIC DEVICE
50: CONDUCTIVE LAYER
59: BASE JOINT PORTION
60: EXTENSION PORTION
61: BASE JOINT PORTION
62: EXTENSION PORTION

The invention claimed is:

1. A joint structure comprising:
a first structure; and
a second structure joined to the first structure via a joint portion formed of a Au—Sn-based alloy, wherein
a thickness of the joint portion is 3 μm or more and 50 μm or less,
the joint portion contains:
  Sn of 19 mass % or more and 25 mass % or less;
  a balance containing Au as a main component; and
  any one element of Fe, Cr, and Ni,
a concentration of Fe in a case of containing Fe is 0.1 ppm by mass or more and 10 ppm by mass or less, a concentration of Cr in a case of containing Cr is 0.1 ppm by mass or more and 100 ppm by mass or less, and a concentration of Ni in a case of containing Ni is 1 ppm by mass or more and 5,000 ppm by mass or less, with respect to the entire joint portion.

2. A joint structure comprising:
a first structure; and
a second structure joined to the first structure via a joint portion formed of a Au—Sn-based alloy, wherein
a thickness of the joint portion is 3 μm or more and 50 μm or less, wherein
the joint portion contains:
  Sn of 19 mass % or more and 25 mass % or less;
  a balance containing Au as a main component; and
  a combination of at least two or more elements selected from Fe, Cr, and Ni,
a total concentration of the combination of the elements with respect to the entire joint portion is more than 0.1 ppm by mass and 5,000 ppm by mass or less,
a concentration of Fe in a case of containing Fe is 0.1 ppm by mass or more and 10 ppm by mass or less, a concentration of Cr in a case of containing Cr is 0.1 ppm by mass or more and 100 ppm by mass or less, and a concentration of Ni is in a range of 0 ppm by mass or more and 4,990 ppm by mass or less.

3. A method for manufacturing a joint structure,
the joint structure including:
  a first structure; and
  a second structure joined to the first structure via a joint portion formed of a Au—Sn-based alloy,
the method comprising:
  a ball fixing step of fixing a solder ball formed of the Au—Sn-based alloy to a first joint surface of the first structure; and
  a step of turning over the first structure with respect to the second structure with the first joint surface facing the second joint surface of the second structure to electrically connect the first joint surface and the second joint surface, wherein a thickness of the joint portion is 3 μm or more and 50 μm or less.

4. The method for manufacturing a joint structure according to claim 3, wherein the ball fixing step includes a multiple fixing step of fixing the solder ball to the first joint surface with a plurality of the solder balls stacked in a height direction.

5. The method for manufacturing a joint structure according to claim 3, wherein in the ball fixing step, the solder ball is fixed to the first joint surface in a close-packed manner.

6. The method for manufacturing a joint structure according to claim 3, wherein when a diameter of the solder ball is R1 and a thickness of the joint portion is t, the solder ball is disposed on the first joint surface at an interval L represented by the following equation (1) in the ball fixing step:

$$L=\sqrt{(2R_1^3/3t)} \qquad (1)$$

7. The method for manufacturing a joint structure according to claim 3, wherein
the solder ball contains:
  Sn of 19 mass % or more and 25 mass % or less;
  a balance containing Au as a main component; and
  any one element of Fe, Cr, and Ni,
a concentration of Fe in a case of containing Fe is 0.1 ppm by mass or more and 10 ppm by mass or less, a concentration of Cr in a case of containing Cr is 0.1 ppm by mass or more and 100 ppm by mass or less, and a concentration of Ni in a case of containing Ni is 1 ppm by mass or more and 5,000 ppm by mass or less, with respect to the entire solder ball.

8. The method for manufacturing a joint structure according to claim 3, wherein
the solder ball contains:
  Sn of 19 mass % or more and 25 mass % or less;
  a balance containing Au as a main component; and
  a combination of at least two or more elements selected from Fe, Cr, and Ni,
a total concentration of the combination of the elements is more than 0.1 ppm by mass and 5,000 ppm by mass or less with respect to the entire solder ball, a concentration of Fe in a case of containing Fe is 0.1 ppm by mass or more and 10 ppm by mass or less, a concentration of Cr in a case of containing Cr is 0.1 ppm by mass or more and 100 ppm by mass or less, and a concentration of Ni is in a range of 0 ppm by mass or more and 4,990 ppm by mass or less.

9. The method for manufacturing a joint structure according to claim 5, wherein
the solder ball contains Sn of 19 mass % or more and 25 mass % or less and a balance containing Au as a main component,
a central cross section of the solder ball includes a lamellar structure composed of a first phase mainly composed of $Au_5Sn$ and a second phase mainly composed of AuSn, and
in four frames having a square shape and evenly disposed in a circumferential direction of the solder ball, the frame having, as a diagonal line, a line segment having a length of 5 μm from a position where a line passing through a center of the solder ball and parallel to the central cross section intersects with an outer edge of the solder ball toward the center, an average number of the first phases being massive and having longitudinal and lateral lengths two times or more an interval between the first phase and the second phase is three or less.

10. A solder ball comprising:
Sn of 19 mass % or more and 25 mass % or less; and
a balance containing Au as a main component, wherein the solder ball contains any one element of Fe, Cr, and Ni,
a concentration of Fe in a case of containing Fe is 0.1 ppm by mass or more and 10 ppm by mass or less, a concentration of Cr in a case of containing Cr is 0.1 ppm by mass or more and 100 ppm by mass or less, and a concentration of Ni in a case of containing Ni is 1 ppm by mass or more and 5,000 ppm by mass or less, with respect to the entire solder ball.

11. A solder ball comprising:
Sn of 19 mass % or more and 25 mass % or less; and
a balance containing Au as a main component, wherein the solder ball contains a combination of at least two or more elements selected from Fe, Cr, and Ni,
a total concentration of a combination of the elements is more than 0.1 ppm by mass and 5,000 ppm by mass or less with respect to the entire solder ball, a concentration of Fe in a case of containing Fe is 0.1 ppm by mass or more and 10 ppm by mass or less, a concentration of Cr in a case of containing Cr is 0.1 ppm by mass or more and 100 ppm by mass or less, and a concentration of Ni is in a range of 0 ppm by mass or more and 4,990 ppm by mass or less.

12. The solder ball according to claim 10, wherein the concentration of Fe is 0.1 ppm by mass or more and 5 ppm by mass or less.

13. The solder ball according to claim 10, wherein the concentration of Ni is 20 ppm by mass or more and 50 ppm by mass or less.

14. The solder ball according to claim 10, wherein the concentration of Ni is 1,000 ppm by mass or more and 3,800 ppm by mass or less.

15. The solder ball according to claim 10, wherein the concentration of Ni is 1,300 ppm by mass or more and 2,500 ppm by mass or less.

16. A solder ball comprising:
Sn of 19 mass % or more and 25 mass % or less; and
a balance containing Au as a main component, wherein
a central cross section of the solder ball includes a lamellar structure composed of a first phase mainly composed of $Au_5Sn$ and a second phase mainly composed of AuSn, and
in four frames having a square shape and evenly disposed in a circumferential direction of the solder ball, the frame having, as a diagonal line, a line segment having a length of 5 μm from a position where a line passing through a center of the solder ball and parallel to the central cross section intersects with an outer edge of the solder ball toward the center,
an average number of the first phases being massive and having longitudinal and lateral lengths two times or more an interval between the first phase and the second phase is three or less.

* * * * *